United States Patent [19]

Matsumoto et al.

[11] Patent Number: 4,879,724
[45] Date of Patent: Nov. 7, 1989

[54] SEMICONDUCTOR LASER

[75] Inventors: Kenji Matsumoto, Yokohama; Haruki Kurihara, Tokyo, both of Japan

[73] Assignee: Kabushiki Kaisha Toshiba, Kawasaki, Japan

[21] Appl. No.: 195,684

[22] Filed: May 17, 1988

[30] Foreign Application Priority Data

May 18, 1987 [JP] Japan ................................ 62-118905

[51] Int. Cl.⁴ .............................................. H01S 3/19
[52] U.S. Cl. ....................................... 372/46; 372/45; 372/48
[58] Field of Search ....................... 372/46, 45, 44, 43, 372/48

[56] References Cited

U.S. PATENT DOCUMENTS 4,545,057 10/1985 Hayakawa et al. .................... 372/45
4,546,481 10/1985 Yamamoto et al. .................... 372/48
4,639,925 1/1987 Kurihara et al. ....................... 372/46

FOREIGN PATENT DOCUMENTS 0054489 3/1985 Japan ..................................... 372/43
0097383 5/1987 Japan ..................................... 372/43

OTHER PUBLICATIONS

IEICE Technical Report, Optical & Quantum Electronics (OQE); T. Morimoto et al., Jul. 15, 1986.
Appl. Phys. Letter 42(5) pp. 406-408; S. Yamamoto et al.; Mar. 1, 1983.
IEEE J. Quantum Electron. QE-23, pp. 730-737; P. Vankwikelberge et al.; Jun. 1987.

Primary Examiner—William L. Sikes
Assistant Examiner—Georgia Y. Epps
Attorney, Agent, or Firm—Cushman, Darby & Cushman

[57] ABSTRACT

In a semiconductor laser, a substrate is composed of a semiconductor basement and a semiconductor current-blocking layer on the basement. A straight channel is grooved into the current-blocking-layer to reach the basement. The straight channel has a constant width and is composed of a shallow window-region-channels in the vicinity of the cavity mirrors and a deep gain-region-channel in the middle of the laser cavity. A first cladding layer is grown on the substrate. A semiconductor active layer is grown on the first cladding layer. A second cladding layer is grown on the active layer. A semiconductor ohmic contact layer is grown on the second cladding layer. A pair of electrodes is deposited on each of the upper and lower surfaces of the semiconductor laser device. A pair of cleaved facets is faced toward the direction perpendicular to the channel.

4 Claims, 8 Drawing Sheets

SEMICONDUCTOR LASER

BACKGROUND OF THE INVENTION

1. Field of the Invention

The present invention relates to a semiconductor laser, and more particularly, to a semiconductor laser with a inner stripe structure.

2. Description of the Related Art

Semiconductor lasers, compared with gas or other solid state lasers, have many advantages such as compactness, high efficiency, high speed response, and high reliability.

Therefore, semiconductor lasers are used more and more as light sources especially for optical disk memory systems and optical communication systems. Optical disk memory systems require shorter wavelengths than optical communication systems. AlGaAs type lasers satisfy this requirement and so many of them are used in massproduced systems such as compact disk (CD) players. However, it is necessary to increase their output power when rewritable optical disk memory systems are developed.

A rewritable optical disk is a read and write memory, while a CD is a read only memory. Information is optically written, read and erased in the rewritable optical disk memory systems. When erasing and writing, much more laser power is needed than when reading. Thus, there appeared a demand for higher power AlGaAs type lasers. These lasers are required to be transverse-mode-stabilized as are the lasers for CD players. This mode stabilization is achieved by suppressing higher order transverse modes.

The inner stripe structure as well as other mode-stabilizing structures stabilizes the transverse mode by restricting laser beam width narrow enough to cut off higher order modes. Most CD players use the lasers with this structure because it is much easier to make than other structures. However, the output power of these lasers is limited to below about 10 mW, while rewritable optical disk memory systems require 30 mW at least. Output power of semiconductor lasers is limited by chatastrophic optical power damage (COD) at laser facet in most cases. COD is caused by optical power absorption in the active layer near a facet. Therefore, the maximum output power can be increased by making the active layer effectively transparent in the region near each facet. This region is called the window or window region while the region between the two windows is called a gain region. The semiconductor lasers having such windows are called window structure lasers. The window can be achieved by making the bandgap energy of the active layer higher and/or making the optical power density lower near the facet than in the middle of the laser cavity. To achieve the windows, many structures are proposed.

Figure 1:
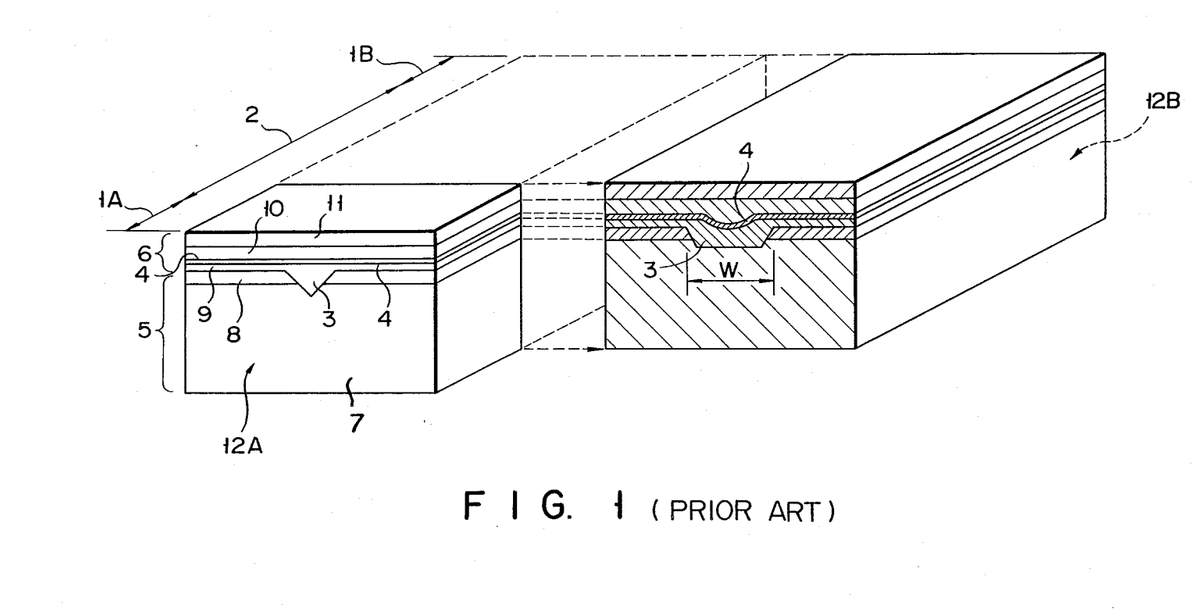
FIG. 1 is a cross-sectional views of a prior art semiconductor laser showing that the channel is wider in the gain region than in the window region.

Applied Physics Letter, vol. 42 No. 5, p406 (1987) and Japanese Patent Disclosure (Kokai) No. 57-211791 disclose a window structure laser with an inner stripe structure. The basic structure of this prior art is shown in FIG. 1. This structure comprises a substrate 5 which is composed of a p-type GaAs basement 7 and an n-type GaAs layer 8, which acts as a current-blocking-layer (CBL), a channel 3 etched into the CBL 8 to reach the basement 7, a p-type $Al_xGa_{1-x}As$ cladding layer 9, a p- or n-type $Al_yGa_{1-y}As$ ($0<y<x<1$) active layer 4, an n-type $Al_xGa_{1-x}As$ cladding layer 10, an n-type GaAs ohmic contact layer 11, and a pair of cleaved facets 12A and 12B which are perpendicular to the channel 3 and act as cavity mirrors to compose a laser cavity. The laser cavity length is about 300 μm. The pumping current injected into the active layer 4 is confined just above the channel because of the CBL 8. As implied by the layer names, the two cladding layers 9 and 10 and the active layer 8 make up an optical wave guide and the laser beam propagates in the active layer 4. The width of the optical wave guide is restricted by the width of the channel 3 because outside the channel 3, the cladding layer 9 is too thin to confine the laser beam in the active layer 4. In semiconductor lasers with an inner stripe structure, the laser beam width should be about 4 μm or less to cut off higher order transverse modes. However, the channel width is about 7 μm in the region 2 and higher order transverse modes might be easily excited. Therefore, the channel 3 is narrowed to about 4 μm in the regions 1A and 1B expecting the higher order modes to be filtered out by these parts. The four layers 4, 9, 10, and 11 are grown by liquid phase epitaxy (LPE) on the substrate 5. In LPE growth on such concaved surface as the channel surface, crystal growth velocity becomes faster as the curvature of the surface is increased. This is considered to be caused by the interface energy between the crystal and the melt. Therefore, the curvature of the epitaxial layer reduces faster in the narrow channel than in the wide channel. Thus, the surface of the p-type $Al_xGa_{1-x}As$ cladding layer 9 can still be concave in the wide channel when it becomes flat over the narrow channel. Then, the active layer 4 is sagging and crescent-shaped in the wide channel and flat and relatively thin over the wide channel. Thus, we gain an active layer as thin as 0.05 μm or less near the facets while as thick as 0.10 μm or more in the middle of the laser cavity. When an active layer is much thinner than the laser light wavelength of about 0.2 μm as it is in this structure, the laser beam is not perfectly confined in the active layer and enlarges its cross-section. Consequently, the optical power density is reduced as the active layer 4 becomes thinner. Therefore, the regions 1A and 1B, where the active layer 4 is thinner than in the region 2, become windows and the region 2 becomes a gain region. Moreover, the bandgap energy of the active layer 4 is higher in the regions 1A and 1B than in the region 2. This helps the regions 1A and 1B act as windows. This bandgap difference comes from the characteristics peculiar to the LPE growth that Al concentration in the $Al_xGa_{1-x}As$ increases as the LPE growth velocity decreases.

Figure 2:
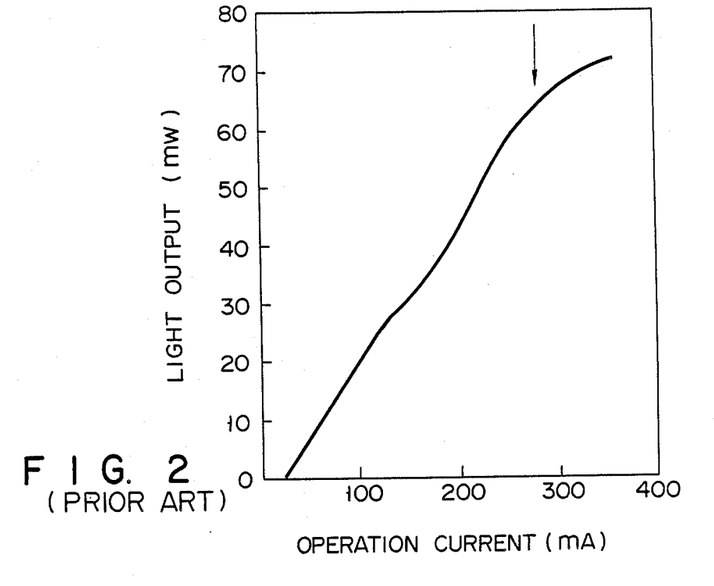
FIG. 2 is a graph showing that the output power versus driving current relation of the laser shown in FIG. 1 exhibits poor linearity and has a kink at a output power less than 50 mW.
Figure 3:
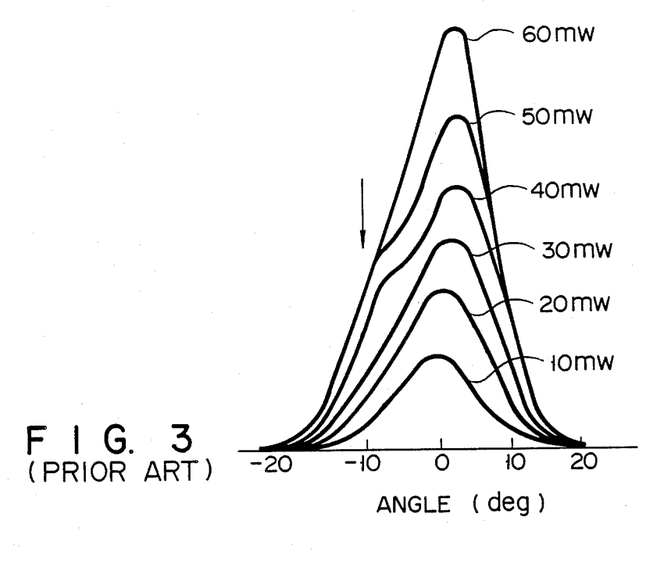
FIG. 3 is a graph showing that the far-field-pattern of the laser shown in FIG. 1 is asymmetric and depends on the output power level.

Thus, this prior art gives the window structure laser with a inner stripe which emits optical power over 70 mW. However, this structure shows transverse mode instability. This instability causes nonlinearity in its optical power versus driving current relation as shown in the FIG. 2 as well as asymmetric and power depending far-field-patterns as shown in FIG. 3. These poor characteristics make it impossible to use this laser in a rewritable optical disk memory system. This transverse mode instability reveals that higher order transverse modes are excited in the gain region and failed to be filtered out by the window regions. This significant drawback is inevitable because the wide channel is necessary to obtain the crescent-shaped active layer in this prior art.

SUMMARY OF THE INVENTION

The object of the present invention is to provide a structure of semiconductor laser which have output power as high as 50 mW or more without lateral mode instability.

The present invention provides a semiconductor laser comprising: a substrate which is composed of a semiconductor basement of a first conductivity type and a semiconductor current-blocking-layer (CBL) of a second conductivity type on the basement; a straight channel grooved into the CBL to reach the basement, having a constant width throughout the laser cavity and being composed of a deep gain-region-channel in the middle of the laser cavity and shallow window-region-channels in the vicinity of cavity mirrors; a first cladding layer of the first conductivity type grown on the substrate by LPE; a semiconductor active layer of the first or second conductivity type grown on the first cladding layer by the LPE and having a crescent-shaped cross-section over the gain-region-channel while being flat and relatively thin over the window-region-channels; a second cladding layer of the second conductivity type grown on the active layer; a semiconductor ohmic layer of the second conductivity type grown on the second cladding layer; a pair of metal electrodes on each of the upper surface and the lower surface; and a pair of cleaved facets perpendicular to the channel and composing a laser cavity.

According to the present invention, the channel width can be constant throughout the laser cavity. Therefore, a window structure is achieved without suffering from transverse mode instability.

According to U.S. Pat. No. 4,639,925, it is preferable to provide a channel deformation-preventing-layer in the CBL near its surface to control the channel width precisely.

DETAILED DESCRIPTION OF THE DRAWINGS

FIG. 5A to 5I are perspective views showing a manufacturing processes of a channeled substrate used in the laser shown in FIG. 4;

DETAILED DESCRIPTION OF THE PREFERRED EMBODIMENT

Figure 4:
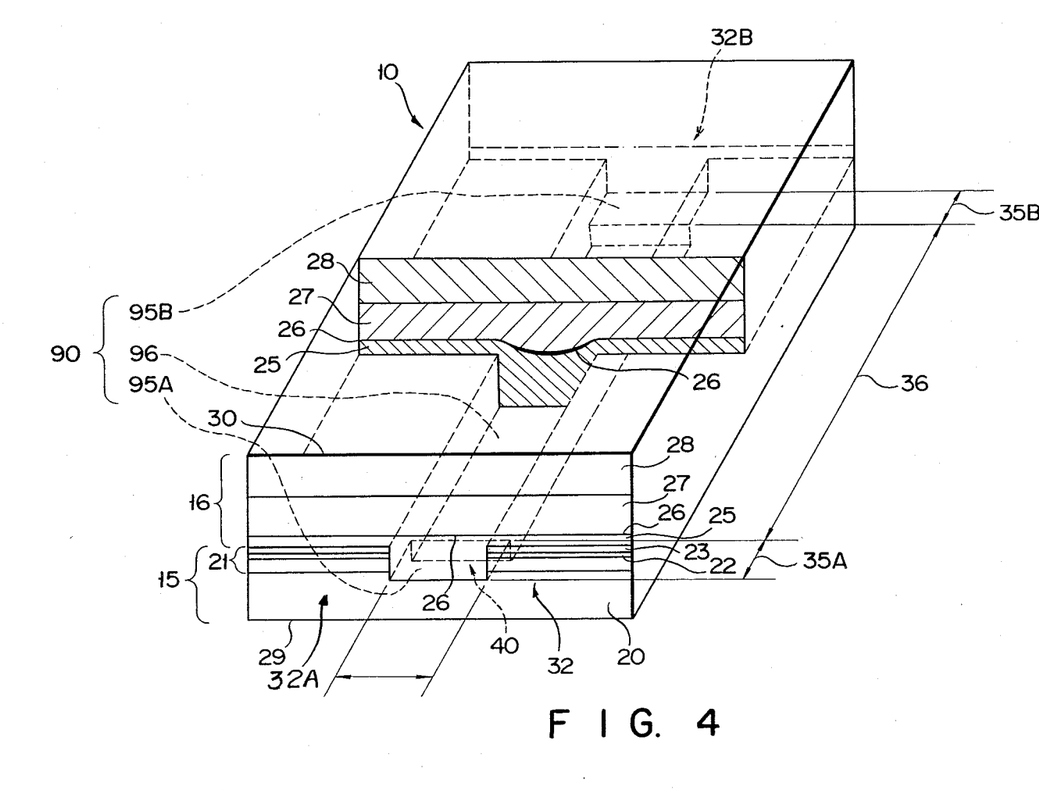
FIG. 4 is a cross-sectional view of a semiconductor laser according to the present invention showing that the channel is deeper in the gain region than in the window region while of constant width throughout the laser cavity.

FIGS. 4 shows a semiconductor laser according to an embodiment of the present invention.

As shown in FIG. 4, a semiconductor laser comprises: a substrate 15 which is composed of a p-type GaAs basement 20 and an n-type GaAs layer 21, which acts as a current-blocking-layer (CBL); an channel deformation-preventing-layer 22 provided in the CBL 21 near its surface and made of $Al_zGa_{1-z}As$ ($z=0.1$); and anti-oxide layer 23 made of p-type GaAs; a channel 90 etched into the CBL 21 to reach the basement 20; a p-type $Al_xGa_{1-x}As$ ($x=0.35$) cladding layer 25; a p- or n-type $Al_yGa_{1-y}As$ ($y=0.056$) active layer 26; an n-type $Al_xGa_{1-x}As$ cladding layer 27; an n-type GaAs ohmic contact layer 28; metal electrodes 29 and 30; and a pair of cleaved facets 32A and 32B which are perpendicular to the channel 90 and act as cavity mirrors to compose a laser cavity. The laser cavity length is about 260 μm. The mirror reflectivities are adjusted to be about 5 % at the front facet and about 95 % at the rear facet by dielectric films.

The laser chip is about 100 μm wide, and 260 μm long. Substrate 15 is about 80 μm thick, the CBL is about 1 μm thick, the channel deformation-preventing-layer 22 is about 0.1 μm thick, the first cladding layer 25 is about 0.2 μm thick outside the channel 90, the second cladding layer 27 is about 2 μm thick, and the ohmic contact layer 28 is about 15 μm thick.

The channel depth is about 1.0 to 2.0 μm, preferably 1.2 μm, in the regions 35A and 35B (window regions) while about 1.4 to 3.0 μm, preferably 2.0 μm in the region 36 (gain regions). The four layers 25, 26, 27, and 28 are grown by liquid phase epitaxy (LPE) on the substrate 15. Owing to the characteristics peculiar to the LPE of AlGaAs, the active layer is made crescent-shaped and as thick as 0.06 μm or more, preferably 0.07 μm over the gain-region-channel while it is flat and as thin as 0.05 μm or less over the window-region-channels 95A and 95B. Owing again to the LPE characteristics, the bandgap energy of the flat active layer is somewhat higher than that of the crescent-shaped active layer. These differences in the active layer thickness and bandgap energy make the window regions effectively transparent to the laser beam. Each of the window regions is about 30 μm long and the gain region is about 200 μm long. What is explained so far is mostly about the features common between the semiconductor laser according to the present invention shown in FIG. 4 and that according to the prior art shown in FIG. 1, while what is explained next is about the feature that makes the semiconductor laser of this invention superior to that of the prior art. In the laser of this invention, the channel width is constant throughout the laser cavity and narrow enough to cut off higher order transverse modes. Specifically, the channel width is 5 μm or less, preferably 4 μm. Thus, this laser can operate in a stable transverse mode, which is impossible using the prior art.

Using FIG. 5A to 5I, the manufacturing processes of the channeled substrate 22 will be explained as follows.

Figures 5A, 5B:
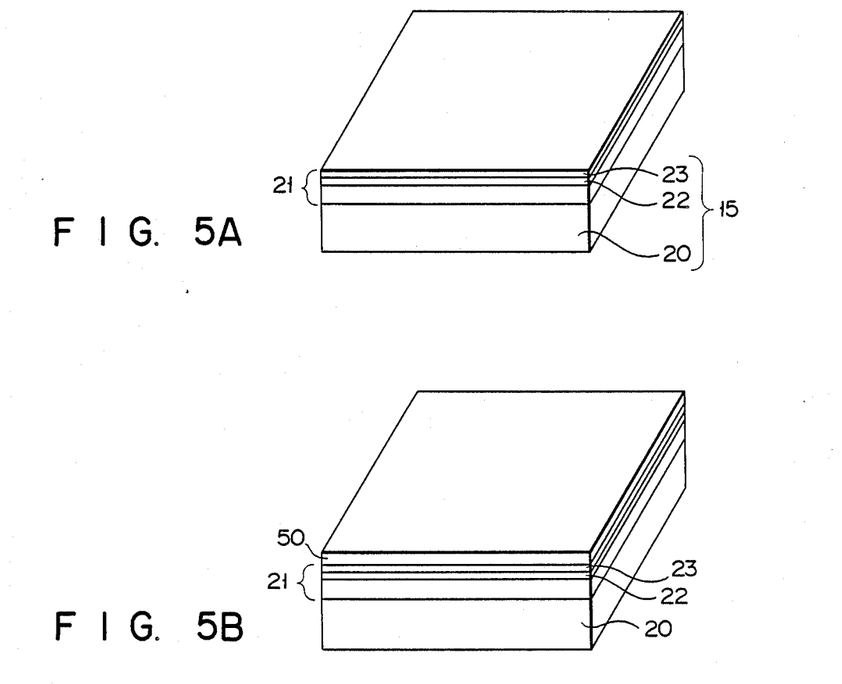

(1) As shown in FIG. 5A, the CBL 25 with the channel deformation-preventing-layer 50 are grown on the basement 20 by LPE.

(2) As shown in FIG. 5B, about 0.25 μm thick $SiO_2$ film 50 is sputtered on the CBL 25.

Figure 5C:
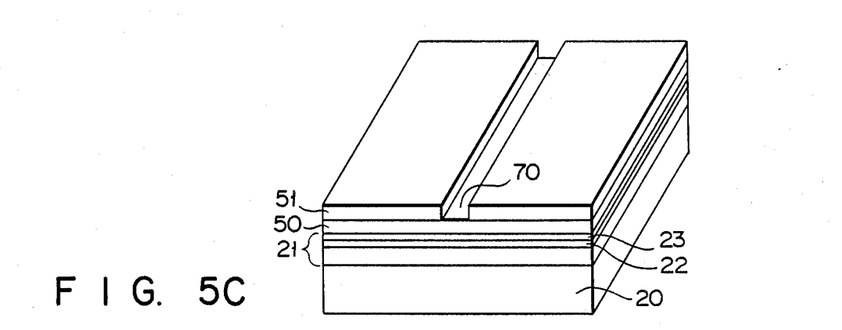

(3) As shown in FIG. 5C, a photoresist film 51 is coated on the SiO$_2$ film 50 and a stripe window 70 is opened through the photoresist film 50 by photolithography.

Figure 5D:
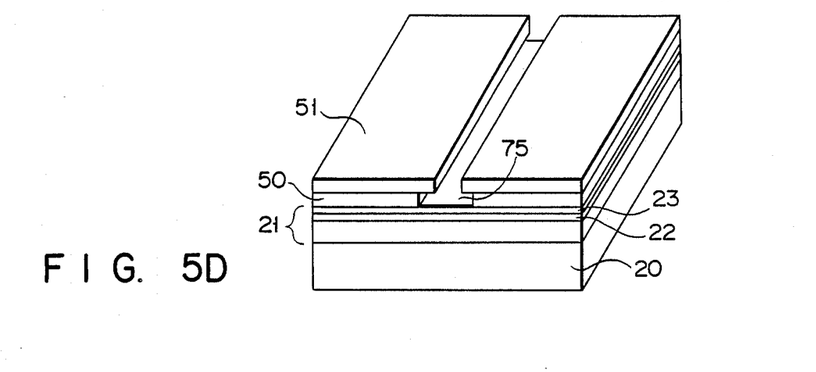

(4) As shown in FIG. 5D, the SiO$_2$ film 50 selectively etched by buffered fluoric acid through the stripe window 70 using the photoresist film 51 as a etching mask. Thus, the stripe window 75 is opened through the SiO$_2$ film 50.

Figure 5E:
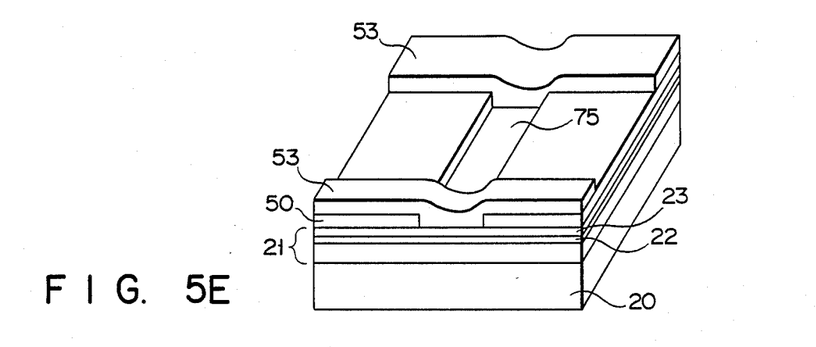

(5) After removing the photoresist film 51, another photoresist film strips 53's are made by photolithography so as to cover the window regions as shown in FIG. 5E.

Figure 5F:
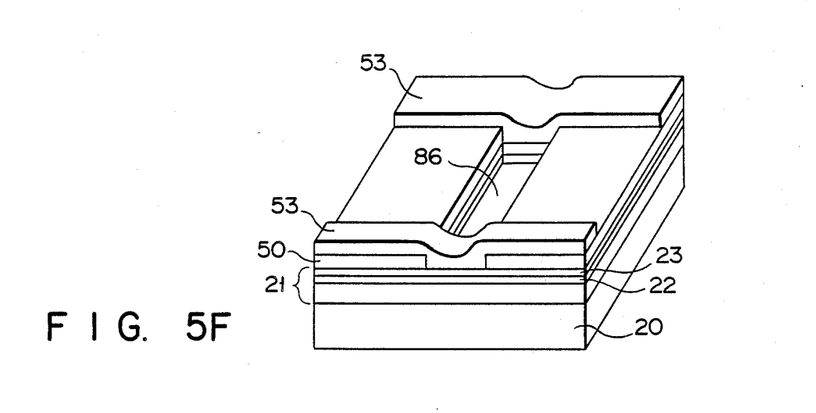

(6) As shown in FIG. 5F, about 0.8 μm deep channel 86 is etched into the substrate 15 by reactive ion etching using the SiO$_2$ film 50 and the photoresist film strips 53's as masks.

Figure 5G:
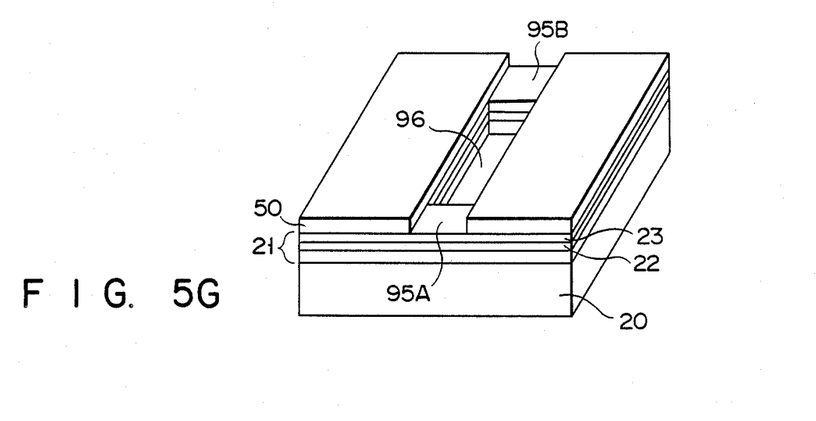

(7) As shown in FIG. 5G, the photoresist film strips 53's are removed.

Figures 5H, 5I:
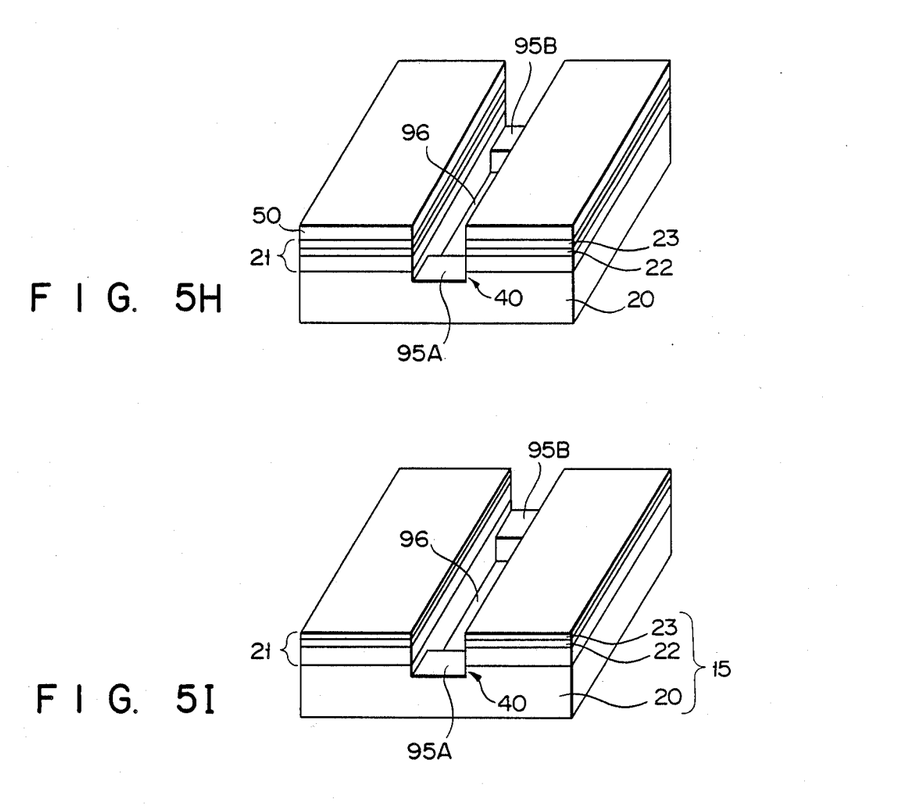

(8) As shown in FIG. 5H, the substrate 15 is again etched by the RIE using the SiO$_2$ film 50 as mask. The etched depth is about 1.2 μm. The resultant channel 26 is about 1.2 μm.

(9) Finally, the SiO$_2$ film 50 is removed by the buffered fluoric acid, as shown in FIG. 5I. The resultant window-region-channels 95A and 95B are about 1.2 μm deep and the gain-region-channel 96 is about 0.8 μm+1.2 μm=2.0 μm deep.

Figure 6:
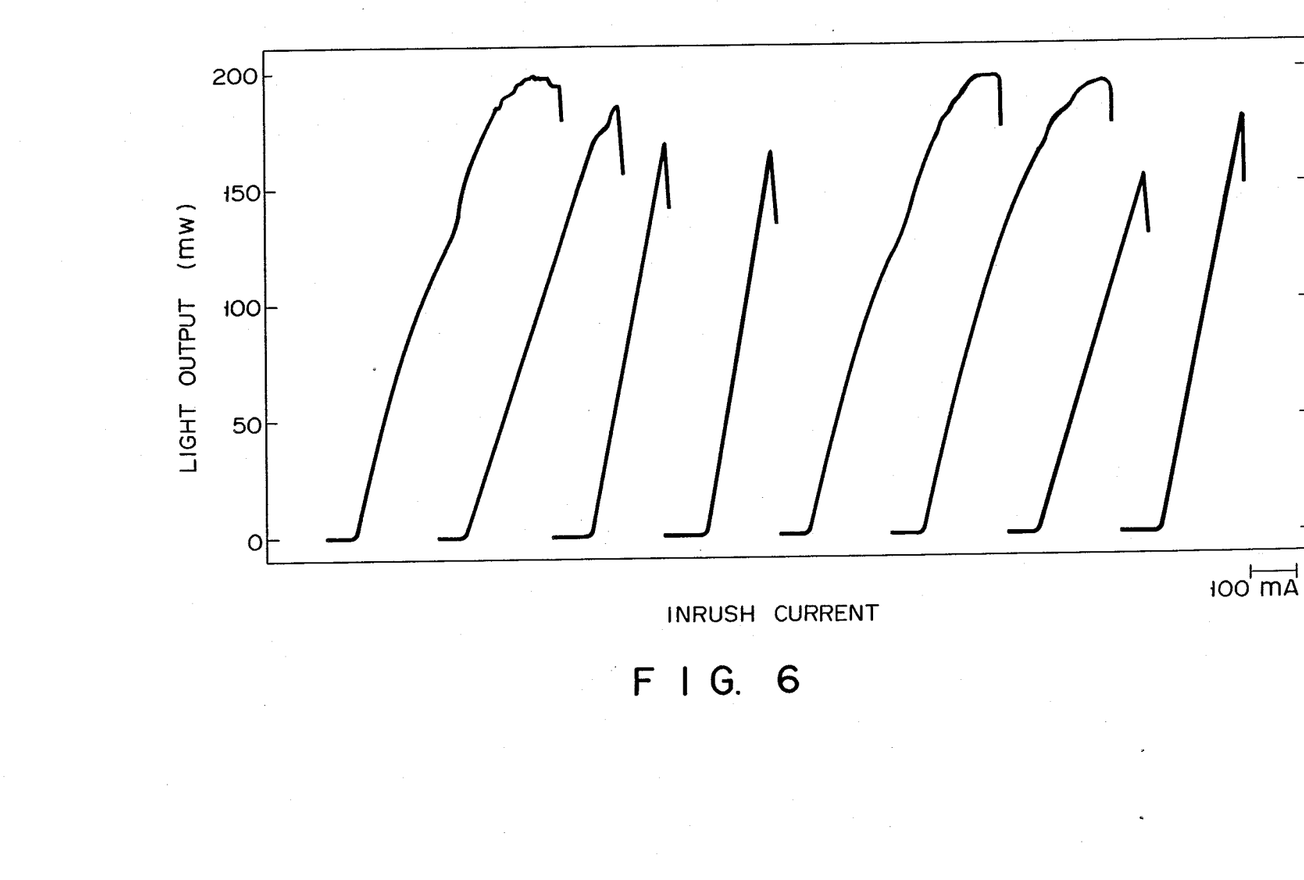
FIG. 6 is a graph showing that the output power versus driving current relation of the laser shown in FIG. 4 exhibits good linearity and has no kinks at a output power over 70 mW.
Figure 7A:
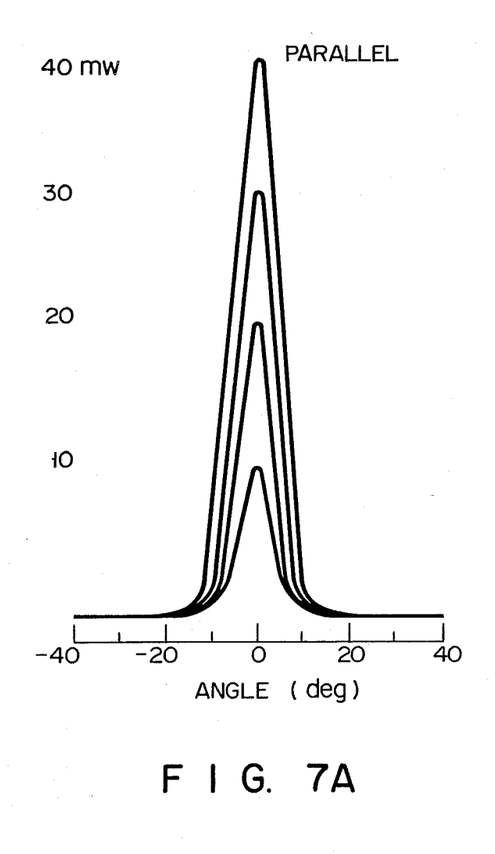
FIG. 7A and 7B are graphs showing that the far-field-patterns of the laser shown in FIG. 4 is symmetric and does not depend on the output power level.
Figure 7B:
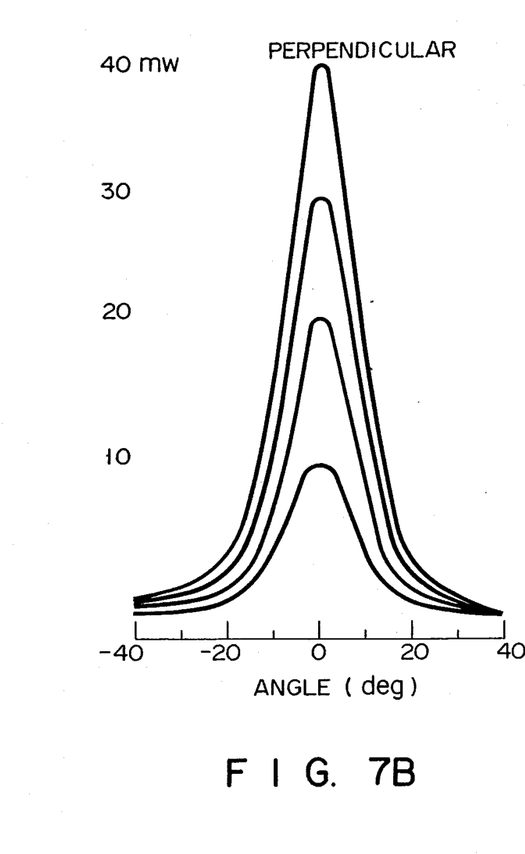

FIGS. 6, 7A and 7B show characteristics of the semiconductor laser of the present invention manufactured in this manner.

FIG. 6 shows output power versus driving current relation of 8 semiconductor lasers. It is demonstrated that every device has COD power over 150 mW and exhibits good linearity with no kinks at an output power over 70 mW.

FIG. 7A shows typical far-field-patterns parallel to the pn-junction plane, while FIG. 7B shows those perpendicular to the pn-junction plane. It is clearly seen that the far-field-patterns are highly symmetric and do not depend on the output power level.

Thus, the laser diodes of this invention are proved to have excellent characteristics suitable for rewritable optical disks. These excellent characteristics suggest that transverse mode is stabilized and window regions are successfully made as expected.

Although the invention has been described in connection with what is presently considered to be the most practical and preferred embodiment, it is to be understood that the invention is not to be limited to the disclosed embodiment. On the contrary, the invention covers various modification such as laser diodes made of other material, of different dimensions and made by different manufacturing techniques as long as the modification is within the spirit and scope of the appended claims.

What is claimed is:

1. A semiconductor laser comprising:
   a substrate including a semiconductor basement of a first conductivity type and a semiconductor current-blocking-layer of a second conductivity type formed on said basement;
   a straight channel groove formed within said basement;
   a first cladding layer of the first conductivity type grown on said substrate by a liquid-phase-epitaxy (LPE);
   a semiconductor active layer formed on said first cladding layer and grown by the LPE;
   a second cladding layer of the second conductivity type formed on said active layer;
   a semiconductor ohmic contact layer of the second conductivity type formed on said second cladding layer;
   a first metal electrode disposed on said semiconductor ohmic layer;
   a second metal electrode disposed on a lower surface of said semiconductor basement; and
   a pair of cleaved facets perpendicular to said channel groove and forming front and back ends of a laser cavity with said channel groove having a constant width throughout said laser cavity and a shallow channel portion of a first height in the vicinity of said cleaved facets and a deep channel portion of a second height, higher than said first height, in a middle portion of said laser cavity.

2. A semiconductor laser according to claim 1, wherein said active layer is thicker over said deep channel portion than over said shallow channel portion.

3. A semiconductor laser according to claim 2, wherein said active laser is crescent-shaped over said deep channel portion while flat over said shallow channel portion.

4. The semiconductor laser according to claim 1, further comprising a channel-deformation-preventing-layer provided in said current-blocking-layer, whereby deformation of said channel, which may otherwise be caused while said first cladding layer is grown, is prevented.

* * * * *